(12) United States Patent
Robinson et al.

(10) Patent No.: US 8,758,979 B2
(45) Date of Patent: Jun. 24, 2014

(54) PHOTORESIST COMPOSITION

(75) Inventors: Alex Robinson, Birmingham (GB); Richard Palmer, Stourbridge (GB); Jon Andrew Preece, Birmingham (GB)

(73) Assignee: The University of Birmingham, Edgbaston, Birmingham (GB)

( * ) Notice: Subject to any disclaimer, the term of this patent is extended or adjusted under 35 U.S.C. 154(b) by 145 days.

(21) Appl. No.: 13/505,601

(22) PCT Filed: Nov. 18, 2010

(86) PCT No.: PCT/GB2010/002129
§ 371 (c)(1),
(2), (4) Date: Jun. 20, 2012

(87) PCT Pub. No.: WO2011/061501
PCT Pub. Date: May 26, 2011

(65) Prior Publication Data
US 2012/0251953 A1   Oct. 4, 2012

(30) Foreign Application Priority Data
Nov. 18, 2009   (GB) .................................. 0920231.8

(51) Int. Cl.
*G03F 7/004* (2006.01)
*G03F 7/40* (2006.01)

(52) U.S. Cl.
USPC ........ 430/270.1; 430/322; 430/325; 430/330; 430/331; 430/913

(58) Field of Classification Search
USPC ............... 430/270.1, 913, 330, 331, 322, 325
See application file for complete search history.

(56) References Cited

U.S. PATENT DOCUMENTS

| | | | |
|---|---|---|---|
| 6,117,617 A * | 9/2000 | Kanayama et al. | 430/296 |
| 8,034,546 B2 * | 10/2011 | Robinson et al. | 430/325 |
| 2006/0188809 A1 | 8/2006 | Hatakeyama et al. | |
| 2007/0190447 A1 | 8/2007 | Ogata et al. | |
| 2007/0292855 A1 | 12/2007 | Dubin et al. | |
| 2008/0118874 A1 * | 5/2008 | Robinson et al. | 430/327 |
| 2008/0199814 A1 | 8/2008 | Brzozowy et al. | |
| 2008/0227037 A1 | 9/2008 | Hatakeyama et al. | |

FOREIGN PATENT DOCUMENTS

| | | |
|---|---|---|
| EP | 0 903 637 A2 | 3/1999 |
| KR | 20090113607 | 4/2008 |
| WO | WO 2006/030234 A2 | 3/2006 |

OTHER PUBLICATIONS

Robinson et al., "Systematic Studies of Fullerene Derivatives in Electron Beam Resists," Materials Research Society, vol. 584, 2000, pp. 115-122.*
Robinson, A.P.G., et al; "Exposure mechanism of fullerene derivative electron beam resists"; *Chemical Physics Letters*, vol. 312, No. 5-6 (1999) XP002629646.
Robinson, A.P.G., et al; "Exposure mechanism of fullerene derivative electron beam resists"; *Chemical Physics Letters*, vol. 312, No. 5-6, pp. 469-474 (1999) XP002629646.
GB Search Report, issued in Patent Application No. GB0920231.8, dated Sep. 22, 2010.

* cited by examiner

*Primary Examiner* — Amanda C. Walke
(74) *Attorney, Agent, or Firm* — Nixon & Vanderhye, P.C.

(57) ABSTRACT

Methanofullerene derivatives having side chains with acid-labile protecting groups. The methanofullerene derivatives may find application as photoresist materials, and particularly as positive-tone photoresists.

22 Claims, 6 Drawing Sheets

PHOTORESIST COMPOSITION

This application is the U.S. national phase of International Application No. PCT/GB2010/002129 filed 18 Nov. 2010 which designated the U.S. and claims priority to British Application No. 0920231.8 filed 18 Nov. 2009, the entire contents of each of which are hereby incorporated by reference.

The present invention relates to certain methanofullerene derivatives. Such materials may be useful as photoresist materials. The invention also relates to the use of the methanofullerene derivatives as photoresist materials, to photoresist compositions comprising the methanofullerene derivatives, and to methods for forming a patterned resist layer on a substrate comprising forming a coating layer comprising at least one methanofullerene derivative,

BACKGROUND OF THE INVENTION

As is well known, the manufacturing process of various kinds of electronic or semiconductor devices such as ICs, LSIs, and the like, involves a fine patterning of a resist layer on the surface of a substrate such as a semiconductor silicon wafer. This fine patterning process has traditionally been conducted by the photolithographic method in which the substrate surface is uniformly coated with a thin layer of a positive or negative tone photoresist composition. The photoresist composition is then selectively irradiated with actinic radiation (such as ultraviolet light) through a photomask (which may be a passive mask such as a chrome pattern on glass, an active mask such as mirrors to selectively deflect the radiation, or a virtual mask formed by selectively deflecting charged particle radiation using for instance electromagnets or electrostatic fields). The irradiation is followed by a development treatment which selectively dissolves away the photoresist layer in the areas exposed (in the case of positive tone photoresists) or unexposed (in the case of negative tone photoresists) to the actinic radiation, to leave a patterned resist layer on the substrate surface. The patterned resist layer is then utilised as a mask in subsequent treatment (such as etching) of the substrate surface.

The fabrication of structures with dimensions of the order of nanometres is an area of considerable interest, since it enables the realisation of electronic and optical devices which exploit phenomena such as quantum confinement effects, and also allows greater component packing density. As a result, the resist layer is required to have an ever-increasing fineness which can be accomplished only by using actinic radiation having a shorter wavelength than the conventional ultraviolet light. Accordingly, it is now the case that electron beams (e-beams), excimer laser beams, EUV and X-rays are commonly used as the short-wavelength actinic rays. The minimum size of structures obtainable is determined both by the wavelength of the actinic radiation, and by the performance of the resist material used.

Various materials have been proposed as suitable resist materials. These include organic resinous materials such as methacrylic resin-based, polystyrene-based, and novolac resin-based materials. In the case of negative tone resists based on polymer crosslinking, there is an inherent resolution limit of about 10 nm, which is the approximate radius of a single polymer molecule.

It is also known to apply a technique called 'chemical amplification' to the resist materials. A chemically amplified resist material is generally a multi-component formulation, in which there is a main resist component, such as novolac resin which contributes towards properties such as resistance of the material to etching and mechanical stability; optionally one or more additional components which impart desired properties to the resist; and a sensitizer. By definition, the chemical amplification occurs through a catalytic process involving the sensitizer, which results in a single irradiation event resulting in the 'exposure' of multiple molecules of the main resist component. In a typical example, the resist material comprises a polymer (the main resist component) and a photoacid generator (PAG) (the sensitizer). Upon irradiation (with actinic radiation), the PAG releases a proton which then reacts with a molecule of the polymer to cause it to lose a dissolution-inhibiting group (in the case of a positive tone resist). In the process, a second proton is generated which can then react with a further molecule. The speed of the reaction can be controlled, for example, by heating the resist film to drive the reaction. The reacted polymer molecules are soluble in a 'developer' (solvent), and hence can be removed whilst the unreacted polymer is not, and remains in place as a patterned resist layer. In this way the sensitivity of the material to actinic radiation is greatly increased, as small numbers of irradiation events give rise to a large number of exposure events.

Published International Patent Application WO 2006/030234 A2 describes the use of certain methanofullerene derivatives as negative-tone photoresists in compositions with a photoacid generator and an epoxy novolak crosslinker. Such photoresists showed good sensitivity, resolution and high etch durability. However, development of the irradiated resist requires the use of toxic organic solvents, which is disadvantageous in an industrial context.

SUMMARY OF THE INVENTION

There is therefore a desire for a photoresist material able to obviate or mitigate one or more of the disadvantages associated with the prior art.

According to a first aspect of the invention, there is provided a methanofullerene derivative comprising a fullerene core of general formula $C_{2x}$ and at least one addend of general formula (I):

wherein x is at least 10, and $R^1$ and $R^2$ represent separate or linked organic groups, provided that at least one of $R^1$ and $R^2$ has a structure of general formula (III):

where $R^4$ is an organic group selected from alkylene, alkenylene, arylene, ether, thioether, and combinations thereof, and $R^5$ is selected from:

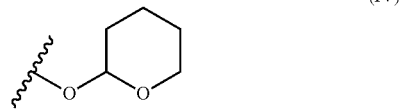

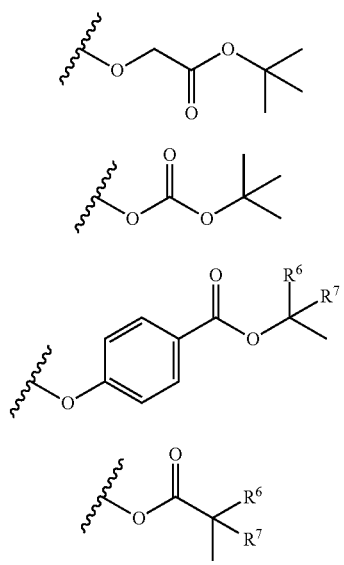

(V)

(VI)

(VII)

(VIII)

where $R^6$ is $CH_3$ and $R^7$ is $CH_3$, $CH_2CH_3$, or $CH(CH_3)_2$, or $R^6$ is $CH(CH_3)_2$ and $R^7$ is $CH(CH_3)_2$ (IX)

(X)

(XI)

(XII)

(XIII)

(XIV)

(XV)

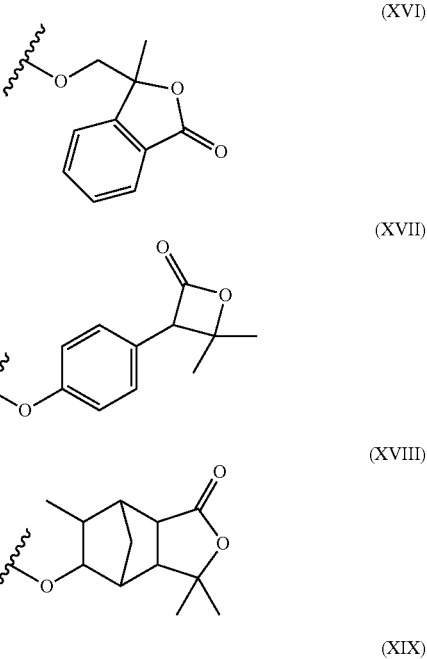

(XVI)

(XVII)

(XVIII)

(XIX)

with the exception of the case where $R^4$ is an ether and $R^5$ has structure (IV).

Without wishing to be bound by theory, it is believed that structures (XV) to (XIX) are particularly suitable for detection using mass spectrometry.

It will be understood that, in some embodiments, the methanofullerene derivative may comprise more than one such addend, and the addends may be the same or different. In some further embodiments, the methanofullerene derivative has between 1 and 6 such addends. In some still further embodiments, the methanofullerene derivative has 1, 2, 4 or 6 such addends. Furthermore, the groups $R^1$ and $R^2$ within a single addend may be the same or different. In some embodiments, the fullerene core may have one or more further addends, such as for example hydroxyl groups.

In some embodiments, $R^4$ comprises arylene. In some further embodiments, at least one of $R^1$ and $R^2$ has a structure of general formula (A):

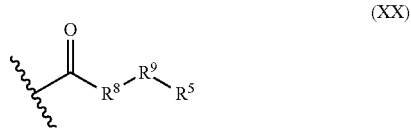

(XX)

where $R^8$ is an organic group selected from alkylene, alkenylene, arylene, ether, thioether, and $R^9$ is arylene or an arylene ether. In some still further embodiments, $R^9$ is a phenylene ether, such as for example p-phenylene ether.

In some embodiments, at least one of $R^1$ and $R^2$ has a structure of general formula (XXI):

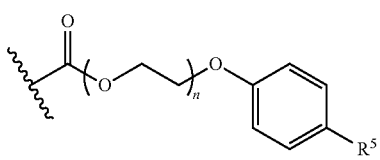

(XXI)

where n=1 to 10. In some still further embodiments, n=2. In some still further embodiments, $R^5$ has structure (VI).

It will be understood that the groups $R^1$ and $R^2$ may be monovalent (i.e. attached only to the carbon atom of formula (I), with the other end being free). Alternatively or additionally, the groups $R^1$ and $R^2$ may be multiply-valent, with one attachment to the carbon atom of formula (I) and additional attachments being for example to other such addend organic groups, or the fullerene core.

These compounds are suitable for use in photoresist composition with a photoacid generator. Without wishing to be bound by theory, it is believed that irradiation of the photoacid generator causes the production of acid, which converts the group $R^5$ into a polar functional group, increasing the solubility of the methanofullerene derivative in polar solvents. This allows development of the positive-tone photoresist in polar solvents, such as for example water and/or isopropyl alcohol. Such solvents may have fewer environmental hazards than their non-polar counterparts. In particular, the ability to develop photoresists in aqueous solutions is of interest.

Of course, the organic groups $R^1$ and $R^2$ may also contain (within the same molecule, and even within the same groups) functionality which would enable use as a negative-tone resist. For example, the groups may contain polymerisable functionality which is able (either inherently, or with the addition of a crosslinking agent) to form a crosslinked structure on exposure to suitable actinic radiation. By tuning the exposure conditions and/or formulation of a suitable photoresist composition, the same methanofullerene derivative could be employed in different functions.

In some embodiments, the fullerene core is selected from $C_{50}$, $C_{60}$, and $C_{70}$. In some further embodiments, the fullerene core is $C_{60}$.

In some embodiments, $R^4$ has between 1 and 20 C atoms. In some further embodiments, $R^4$ has between 1 and 10 C atoms. For example, $R^4$ may be methylene, ethylene, trimethylene, tetramethylene, pentamethylene, hexamethylene, heptamethylene, octamethylene, nonamethylene, or decamethylene, or branched isomers thereof. Alternatively, $R^4$ may be oxyethyl, di(oxyethyl), tri(oxyethyl), tetra(oxyethyl), penta(oxyethyl) or hexa(oxyethyl). Longer oligomers, up to nona(oxyethyl) are also envisaged, as are oligomers of other ether units.

Without wishing to be bound by theory, it is believed that acid-based deprotection of the t-butyl ester of formula (V) will expose the carboxylic acid, thereby significantly increasing the polarity of the addend. Similarly, it is believed that acid-based deprotection of the ether of formula (IV) or the carbonate of formula (VI) will expose the hydroxyl to increase polarity.

According to a second aspect of the invention, there is provided the use of a methanofullerene derivative according to the first aspect as a photoresist material.

In some embodiments, the use comprises use as a positive-tone photoresist material. In some alternative embodiments, the use comprises use as a negative-tone photoresist material.

According to a third aspect of the invention, there is provided the use of a methanofullerene derivative comprising a fullerene core of general formula $C_{2x}$ and at least one addend of general formula (I):

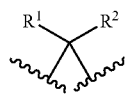

(I)

wherein x is at least 10, and $R^1$ and $R^2$ represent separate or linked organic groups, provided that at least one of $R^1$ and $R^2$ has a structure of general formula (III):

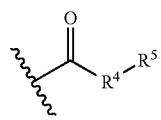

(III)

where $R^4$ is an organic ether and $R^5$ is:

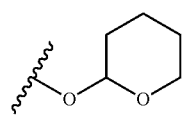

(IV)

as a positive-tone photoresist material.

According to a fourth aspect of the invention, there is provided a photoresist composition comprising a methanofullerene derivative according to the first aspect of the invention.

In some embodiments, the photoresist composition further comprises a sensitizer. In some further embodiments, the sensitizer comprises a photoacid generator (PAG). Examples of suitable photoacid generators include triphenylsulfonium triflate, diphenyliodonium triflate, triarylsulfonium hexafluoroantimonate, and tris(4-tertbutyl-phenyl)sulfonium perfluoro-1-butanesulfonate.

In some embodiments, the photoresist composition further comprises a quencher for quenching the activity of the sensitizer. In some further embodiments where the sensitizer comprises a photoacid generator, the quencher comprises a basic quencher. For example, the quencher may be tripropylamine.

According to a fifth aspect of the invention, there is provided a method for formation of a patterned resist layer on a substrate, comprising forming a coating layer on the substrate surface, the coating layer comprising a methanofullerene derivative comprising a fullerene core of general formula $C_{2x}$ and at least one addend of general formula (I):

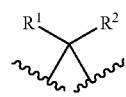

(I)

wherein x is at least 10, and $R^1$ and $R^2$ represent separate or linked organic groups, provided that at least one of $R^1$ and $R^2$ has a structure of general formula (III):

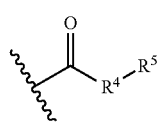

(III)

where $R^4$ is an organic group selected from alkylene, alkenylene, arylene, ether, thioether, and combinations thereof, and $R^5$ is selected from:

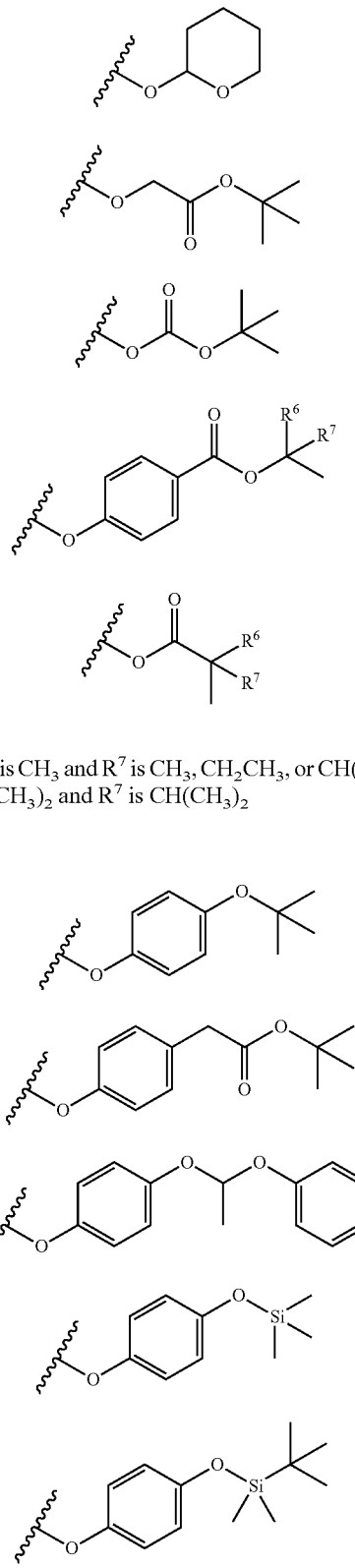

where $R^6$ is $CH_3$ and $R^7$ is $CH_3$, $CH_2CH_3$, or $CH(CH_3)_2$, or $R^6$ is $CH(CH_3)_2$ and $R^7$ is $CH(CH_3)_2$

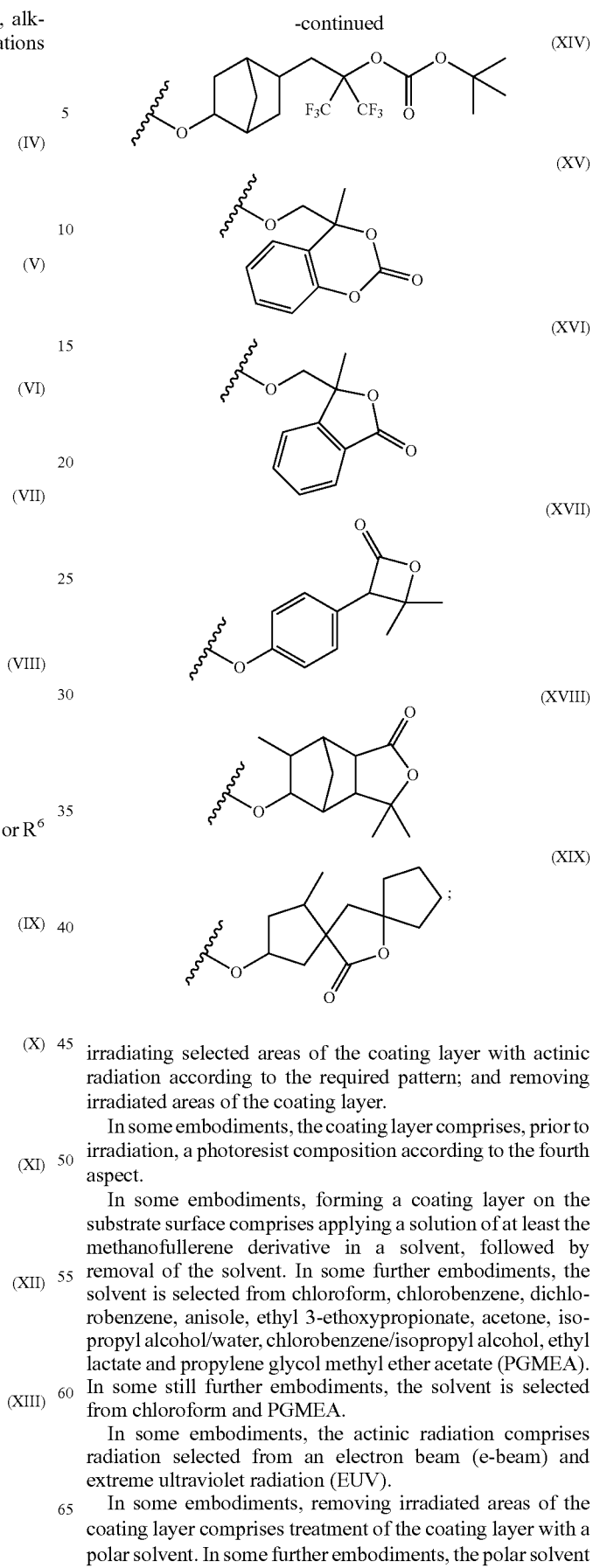

irradiating selected areas of the coating layer with actinic radiation according to the required pattern; and removing irradiated areas of the coating layer.

In some embodiments, the coating layer comprises, prior to irradiation, a photoresist composition according to the fourth aspect.

In some embodiments, forming a coating layer on the substrate surface comprises applying a solution of at least the methanofullerene derivative in a solvent, followed by removal of the solvent. In some further embodiments, the solvent is selected from chloroform, chlorobenzene, dichlorobenzene, anisole, ethyl 3-ethoxypropionate, acetone, isopropyl alcohol/water, chlorobenzene/isopropyl alcohol, ethyl lactate and propylene glycol methyl ether acetate (PGMEA). In some still further embodiments, the solvent is selected from chloroform and PGMEA.

In some embodiments, the actinic radiation comprises radiation selected from an electron beam (e-beam) and extreme ultraviolet radiation (EUV).

In some embodiments, removing irradiated areas of the coating layer comprises treatment of the coating layer with a polar solvent. In some further embodiments, the polar solvent comprises water (such as pure deionised water) or isopropyl alcohol (IPA). In some still further embodiments, the polar solvent comprises tetramethylammonium hydroxide (TMAH) or other quaternary ammonium salt solution (such as for example tetrabutylammonium hydroxide (TBAH) or tetrapropylammonium hydroxide (TPAH)). The quaternary ammonium salt may be present in aqueous solution or in a mixture of different solvents as will be readily apparent to the skilled reader, such as for example isopropyl alcohol and TMAH For example, the polar solvent may consist of an aqueous solution of tetramethyl—ammonium hydroxide, with any other solutes present in trace amounts only. Alternatively, the polar solvent may further comprise one or more developer-enhancing solutes. For example, the polar solvent may comprise an aqueous solution of TMAH with one or more cyclodextrins.

In some embodiments, the method comprises heating of the coated substrate between irradiation with actinic radiation and removal of the irradiated areas. In some further embodiments, the heating comprises heating to between 80 and 140° C., between 90 and 120° C., or between 95 and 110° C.

BRIEF DESCRIPTION OF THE DRAWINGS

Exemplary embodiments of the invention are further discussed below with reference to the accompanying Figures, in which.

EXAMPLE 1

Synthesis of Methanofullerene Derivatives

Figure 1:
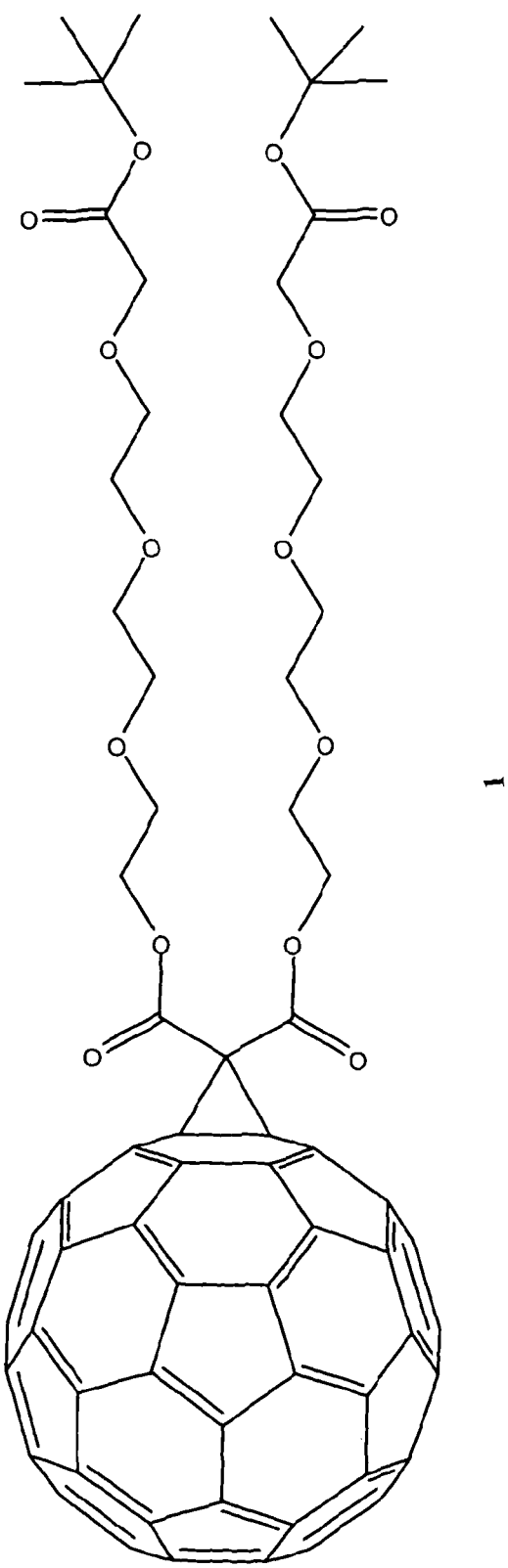
FIG. 1 shows an exemplary methanofullerene derivative 1 having a single addend (Mono-MF)

Methanofullerene derivatives (Mono-MF, Di-MF, Tetra-MF and Hexa-MF) were synthesised via the modified Bingel cyclopropanation reaction of a bismalonate ester with $C_{60}$, as shown in Scheme I.

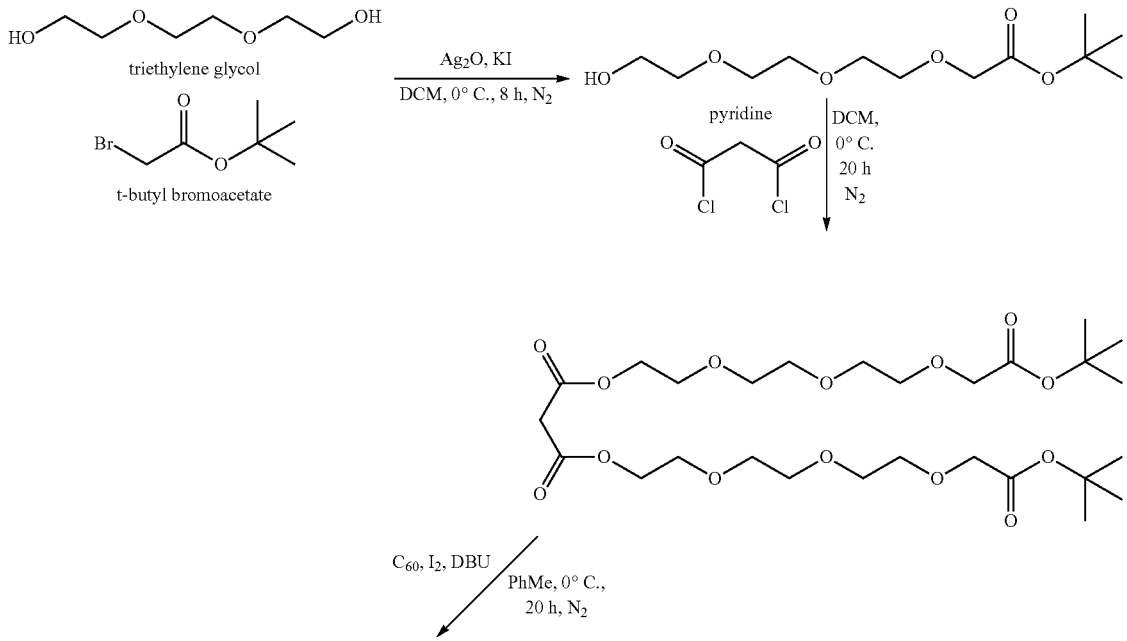

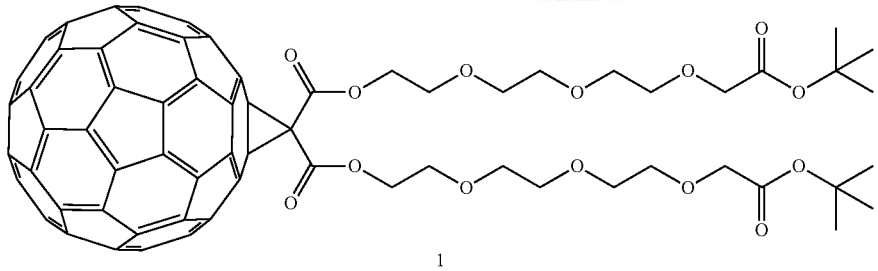

A solution of 1,8-diazobicyclo(5.4.0)undec-7-ene (63.3 mg, 0.41 mmol) in dry degassed PhMe (25 ml) was added dropwise to a stirred, ice-cold solution of $C_{60}$ (100 mg, 0.13 mmol), $CBr_4$ (69.0 mg, 0.20 mmol) and bismalonate ester (124 mg, 0.20 mmol) in dry, $N_2$-degassed PhMe (100 ml) in a round-bottomed flask covered with aluminium foil under a $N_2$ atmosphere. The reaction was stirred overnight and allowed to warm to room temperature. This was followed with plug filtration (silica gel) washing first with PhMe to remove excess $C_{60}$, and secondly with a mixture of $CH_2Cl_2$/EtOAc to elute the product. The second fraction was concentrated in vacuo and the residue was purified by column chromatography ($CH_2Cl_2$/EtOAc) affording the mono-adduct (IV) as a dark brown solid (45 mg, 30%). $^1$H NMR (300 MHz, $CDCl_3$): δ=4.58 (m, 3H), 4.52 (s, 1H), 4.46 (s, 1H), 4.05 (s, 3H), 3.58 (m, 4H), 3.86 (s, 16H), 1.47 (m, 18H). $^{13}$C NMR (75 MHz, $CDCl_3$): δ=164.1, 145.3, 145.2, 144.6, 143.9, 143.0, 142.0, 141.9, 140.9, 71.0, 70.7, 69.0, 68.8, 66.2, 28.1, 28.0, m/z (FABMS): 1314 (M+Na)+.

Following the same general procedure described for the mono-adduct Mono-MF (1), the following compounds were prepared. A di-adduct Di-MF: from $C_{60}$ (100 mg, 0.13 mmol), $CBr_4$ (69 mg, 0.20 mmol), bismalonate ester (166 mg, 0.27 mmol) and 1,8-diazobicyclo(5.4.0)undec-7-ene (63.3 mg, 0.41 mmol). This yielded a dark brown solid (47 mg, 31%). m/z (FABMS): 1932 [M+Na]+. A tri-adduct Tri-MF: from $C_{60}$ (100 mg, 0.13 mmol), $CBr_4$ (69 mg, 0.20 mmol), bismalonate ester (248 mg, 0.51 mmol) and 1,8-diazobicyclo(5.4.0) undec-7-ene (63.3 mg, 0.41 mmol). This yielded a dark brown solid (38 mg, 37%). m/z (FABMS): 2527 [M+Na]+.

A hexa-adduct Hexa-MF was prepared according to the following procedure: a solution of $C_{60}$ (100 mg, 0.13 mmol) and 9,10-dimethylanthracene (DMA) (286 mg, 1.39 mmol) in toluene (100 ml) was stirred at room temperature for 2 hrs. $CBr_4$ (461 mg, 1.39 mmol) and bismalonate ester (828 g, 1.39 mmol) were then added, followed by 1,8-diazobicyclo(5.4.0) undec-7-ene (DBU) (422 mg, 2.8 mmol) dropwise. The reaction mixture was stirred for 24 hrs and then filtered through a silica gel plug in a sintered glass filter funnel, eluting initially with toluene to remove excess $C_{60}$ and then eluting the products with $CH_2Cl_2$/MeOH (20:1). The second fraction was concentrated in vacuo yielding a dark brown solid, which was further purified by silica gel column chromatography (hexane/$CH_2Cl_2$, 1:1) to afford the hexa-adduct (VII) as a brown solid (47 mg, 37%). mlz (FABMS): 4287 [M+Na]+.

EXAMPLE 2

Resist Film Preparation

Resist films were prepared in the same manner for all experiments. Substrates were prepared by cleaving square 4 $cm^2$ chips from a 4-inch heavily-doped n-type silicon wafer. Cleaning was performed using semiconductor grade Puranal chemicals from Riedel-de Haën. Chips were washed ultrasonically in IPA for 15 minutes and then 1 minute in flowing deionised (DI) water (Purite Neptune, 18.2 MΩcm). A hydrogen terminated surface was prepared on the chips using a 10 minute dip in $H_2SO_4$ (95-98%)/$H_2O_2$ [1:1], followed by a 1 minute dip in a weak aqueous solution of hydrofluoric acid, and finally a further 1 minute rinse in flowing DI water. The substrates were then dried with nitrogen and used immediately (within 2 h). Resist films were prepared by dissolving the methanofullerene derivative in a suitable casting solvent, such as chloroform or PGMEA, with solution strength of 15 to 40 $gdm^{-3}$ and spin coating on the silicon substrates at speeds of between 1000 and 3000 rpm for 60 s. Post application bake was applied where available. Chemically amplified (CA) films were prepared by adding photoacid generator to the casting solution in appropriate ratios. A base quencher tripropylamine can be added as an option.

EXAMPLE 3

Sensitivity Evaluation Measurements

The sensitivity of the resists to electron irradiation was evaluated using an FEI XL30SFEG field emission scanning electron microscope. Square areas of the films, 100 μm on a side, were exposed to a range of electron doses of between $5 \times 10^{-7}$ and $1 \times 10^{-3}$ $C/cm^2$ at a beam energy of 20 keV and current of 200 to 500 pA. The dose was calculated from the beam current measured at the sample during exposure and calibrated before and after exposure with a faraday cup. A post exposure bake was not applied. The exposed resist films were dip developed in an aqueous solution of TMAH for 10 s to 60 s, rinsed in DI water, and dried with nitrogen.

The post-development residual thickness of the exposed areas of the resist were measured with a contact surface profiler (Dektak 3st Auto), and plotted against the exposure dose. The plotted film thickness was normalized using the average measured thickness of the fully retained areas. For positive tone resists the sensitivity is defined as the dose at which the film is cleared and contrast can be calculated from the slope of the linear portion of the curve.

Figure 2:
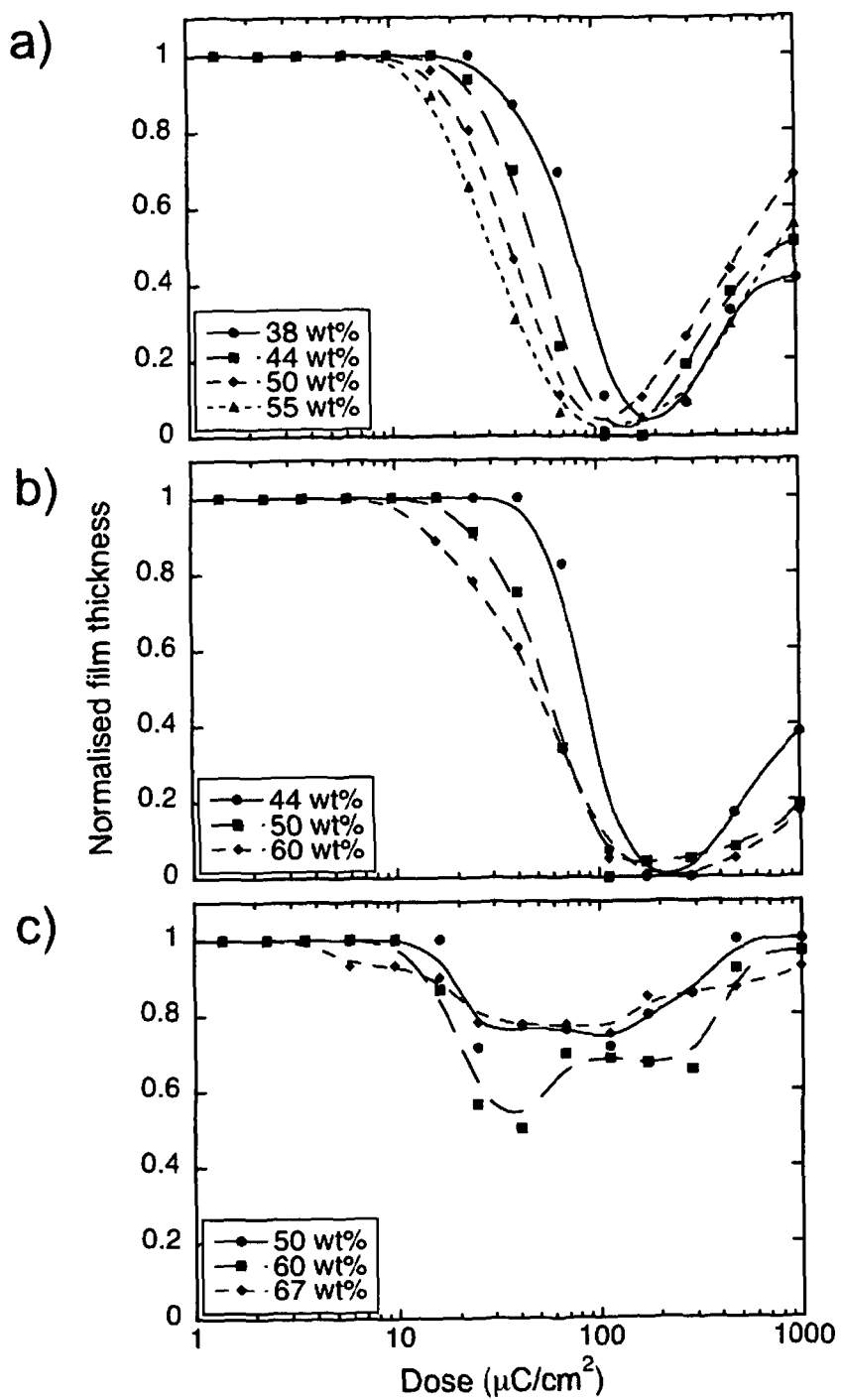
FIG. 2 shows the film thicknesses obtained with methanofullerene derivatives having 6 (Hexa-MF), 2 (Di-MF) and 1 (Mono-MF) addends, following irradiation and development, with different concentrations of photoacid generator.

FIG. 2 shows comparison of the responses for chemically amplified Hexa-MF (FIG. 2(a)), Di-MF (FIG. 2(b)) and Mono-MF 1 (FIG. 2(c)) resist systems using triarylsulfonium hexafluoroantimonate as a photoacid generator (PAG). It can be seen that the number of addends in a fullerene molecule gives a significant impact on resist properties. The resists exhibited dual tone behaviour; they were positive-tone resists in the low dose region and negative-tone resists at higher dose regions. A post-exposure bake of 100° C. for 30 minutes was applied to all samples.

FIG. 2(a) shows the response for Hexa-MF (VII) resists with four different PAG concentrations ranging from 38 to 55 wt %. A post-application bake (PAB) of 100° C. for 30 minutes was applied to all samples. The resist films were developed in DI water for 10 s instead of TMAH solution. The positive-tone Hexa-MF resist with 38 wt % PAG had sensitivity of 140 μC/cm$^2$ with contrast of 2. Sensitivity increased with increasing PAG concentration in opposite to contrast, giving values of 96 μC/cm$^2$, 80 μC/cm$^2$ and 70 μC/cm$^2$ at PAG concentrations of 44 wt %, 50 wt % and 55 wt % respectively. The contrast gradually decreased and it was 1.5 in the resist containing 55 wt % PAG. Onset dose given negative-tone behavior also depended on PAG concentration, approximately between 150 μC/cm$^2$ and 200 μC/cm$^2$.

FIG. 2(b) shows the responses for CA Di-MF resists containing 44 wt %, 50 wt %, or 60 wt % PAG. The resists did not receive PAB or PEB. They were developed in 0.26 N TMAH for 10 s and rinsed in DI water. Resist sensitivity was 136 μC/cm$^2$, 114 μC/cm$^2$ and 123 μC/cm$^2$, and contrast was 2.5, 1.8 and 1.3, for the resists with PAG concentration of 44 wt %, 50 wt %, and 60 wt % respectively. The sensitivity of the Di-MF resists was poorer than that of the Hexa-MF resists at the same PAG concentration, and could not be improved to under 100 ρC/cm$^2$ by adding more PAG. It was obvious that the contrast of the resist also decreased with increasing PAG concentration. Negative tone behavior of Di-MF resist occurred at onset dose of approximately 300 μC/cm$^2$, higher than those of Hexa-MF resists. This may due to difference in the sensitivities of the pure materials.

FIG. 2(c) shows the response for the Mono-MF resists containing different PAG concentrations. The resists did not receive PAB or PEB. They were developed in 0.26 N TMAH for 60 s and rinsed in DI water. It was found that the resist could not be fully developed at any PAG loading, but was partially developed. Further optimisation of the process may improve the results for the Mono-MF resists.

Figure 3:
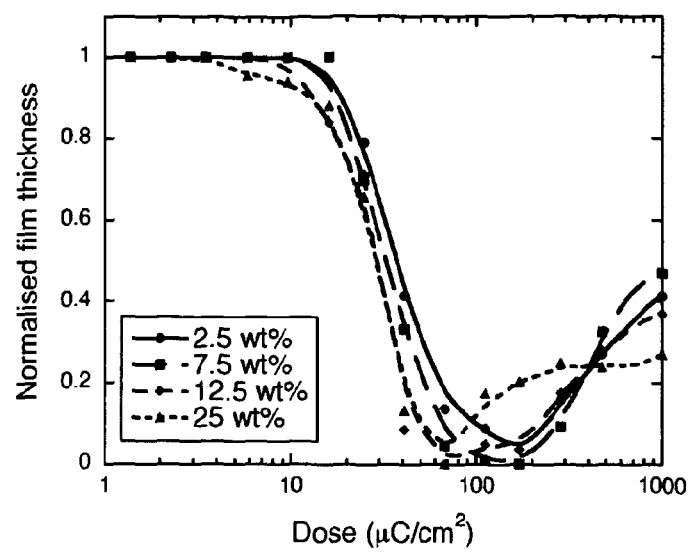
FIG. 3 shows the film thicknesses obtained with methanofullerene derivatives having six addends (Hexa-MF) following irradiation and development, with different mixtures of photoacid generators.

FIG. 3 shows the responses for a chemically-amplified Hexa MF resist system using a mixture of triarylsulfonium hexafluoroantimonate and tris(4-tertbutylphenyl)sulfonium perfluoro-1-butanesulfonate as a photoacid generator. In each case, the total amount of photoacid generator was equal (in molar terms) to the amount of resist material. However, the proportion of tris(4-tertbutylphenyl)sulfonium perfluoro-1-butanesulfonate within the PAG was varied as shown. The samples were prepared as described above, with the addition of a post-exposure bake at 100° C. for 30 minutes, and development in DI water for 10 s.

EXAMPLE 4

Resolution Evaluation Measurements

Figure 4:
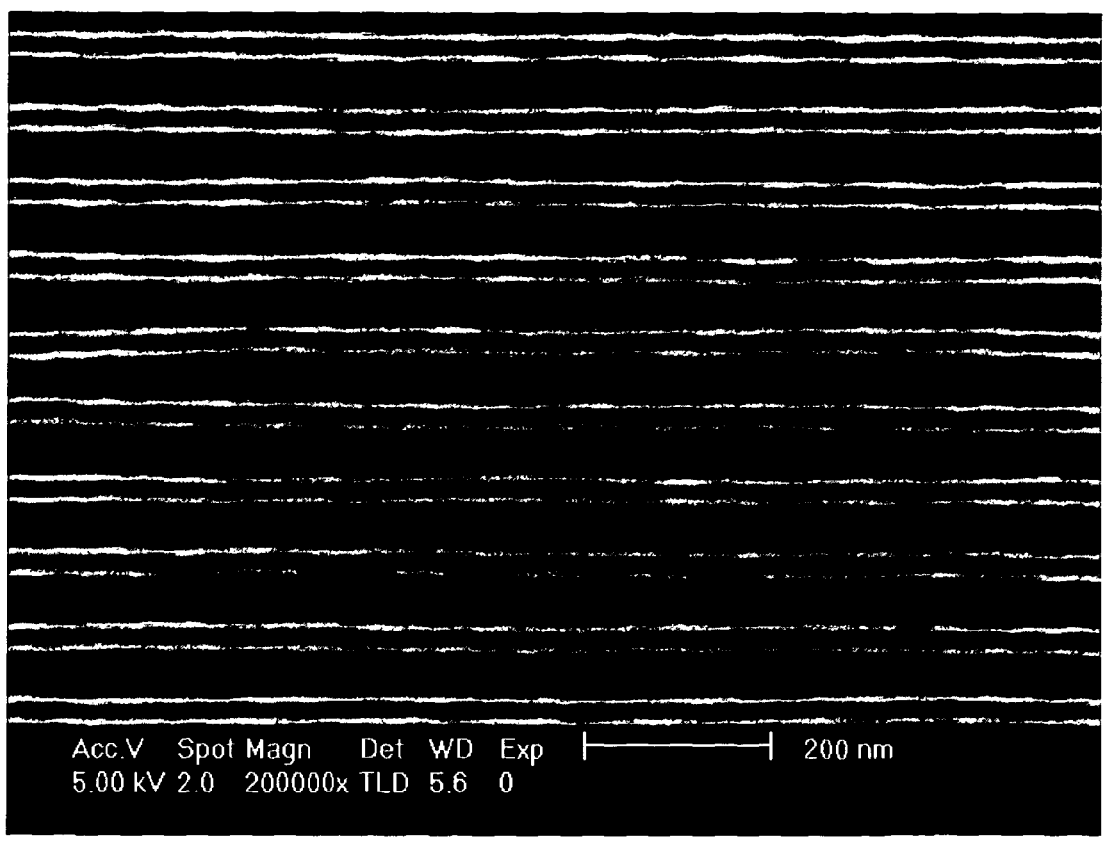
FIG. 4 shows a negative image of 30 nm lines at 80 nm pitch in pure Hexa-MF resist patterned with a line dose of 11 nC/cm, followed by development for 10 s in MCB:IPA [1:1] and rinsed in IPA.
Figure 5:
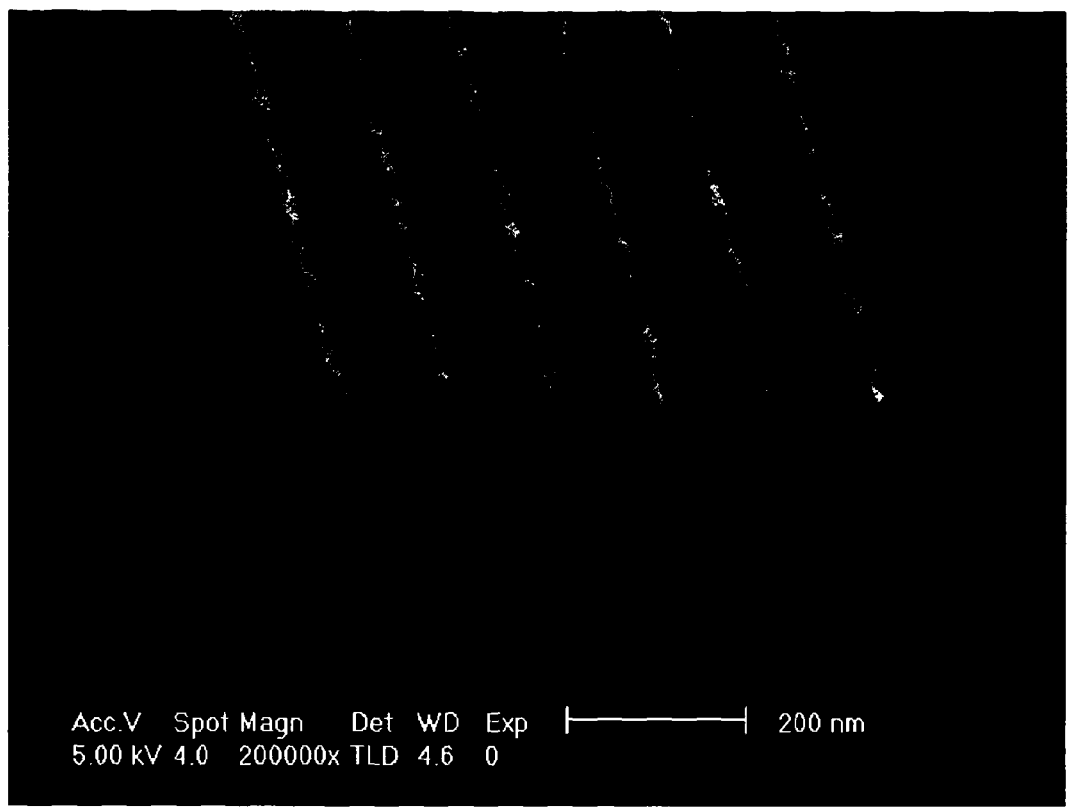
FIG. 5 shows an image of 40 nm lines at 120 nm pitch in chemically-amplified Hexa-MF resist with 50 wt % PAG, followed by development for 10 s in DI water.
Figure 6:
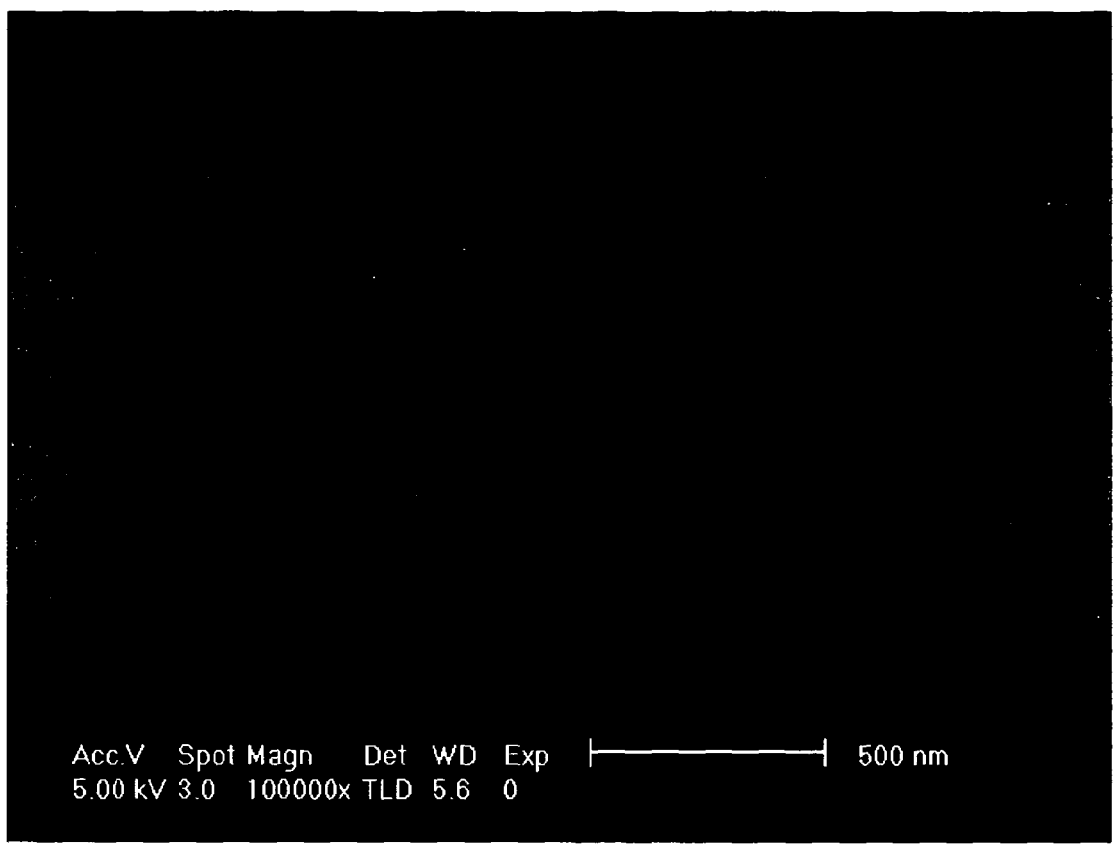
FIG. 6 shows an image of 25 nm lines at 100 nm pitch in chemically-amplified Di-MF resist with 60 wt % PAG, followed by development in 0.026 N TMAH and rinsed in DI water.

To evaluate resist resolution, patterns were written using the FEI XL30SFEG SEM together with a pattern generator (Raith Elphy Quantum). A beam voltage of 30 keV was used for high resolution patterning, with a probe current of between 10 and 30 pA, and a fieldsize of 50 μm. A post exposure bake of was applied to all samples. The exposed films were developed in aqueous solution of TMAH for 10s to 60 s, and then rinsed in DI water before drying with nitrogen. The XL30SFEG SEM was used to evaluate the resolution of the patterns after development. The results are shown in FIGS. 4-6.

The smallest pitch size achievable in Hexa-MF resists was 120 nm. Addition of tripropylamine base quencher to the resist at from 1 to 4 wt % did not help to improve the resolution. The highest resolution was found in Di-MF resists. High resolution was not achieved with development in 0.26 N TMAH. A rather weak TMAH solution of 0.026 N was found suitable for the Di-MF resists. Patterning required higher doses when development in pure DI water. A semi dense pattern of 25 nm space with 100 nm pitch is shown in FIG. 5. The pattern was written with dose of 320 μC/cm$^2$ in Di-MF resist containing 60 wt % PAG. The sample did not receive PAB or PEB. The resist was developed in 0.026 N for 10 s and rinsed in DI water.

EXAMPLE 5

Etch Resistance

Figure 7:
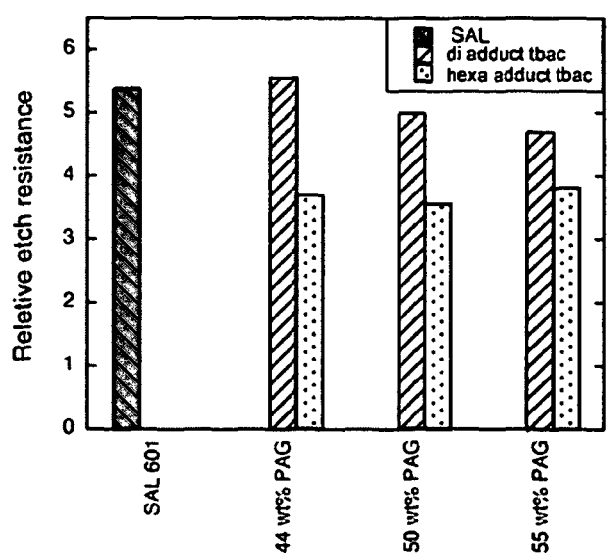
FIG. 7 shows a comparison of relative etch resistance between a commercial negative-tone resist and the positive-tone resist materials of the present invention.

The resistance of the positive tone fullerene resists to plasma etching was evaluated using an Oxford Instuments NGP80 Inductively coupled plasma etcher (ICP). A silicon substrate protected with a resist pattern was anisotropically etched and the etch selectivity between the silicon and the resist was calculated. The commercial (negative-tone) resist SAL601 (Rohm and Haas) was etched simultaneously as a control. The etching process employed a mixture of SF6 and C4F8 at a flow rate of 20 sccm and 30 sccm, respectively. Samples were etched at the RF power of 20 W, the ICP power of 220 W, a pressure of 15 mTorr, and a temperature of 20° C. The relative etch resistance of various resists to that of silicon are shown in FIG. 7. Etch resistance of the SAL601 resist was 5.4 times greater than that of silicon. The hexa adduct tBAC: triarylsulfonium hexafluoroantimonate resists showed comparable values of etch resistance. They were 3.7, 3.5, and 3.8 times that of silicon at PAG loadings of 44 wt %, 50 wt %, and 60 wt %, respectively. The etch resistance of the di adduct tBAC: triarylsulfonium hexafluoroantimonate resists was higher than those formulated with the hexa-adduct derivative and were comparable to SAL601. They were 5.6, 5, and 4.7 times that of silicon, decreasing with increasing amounts of PAG in the resist from 44 wt % to 50 wt %, and 60 wt %, respectively. Since, in the prior art, positive-tone resists have tended to offer much lower etch resistance than negative-tone resists, the ability of the present positive-tone resists to provide comparable etch resistance represents a significant improvement.

EXAMPLE 6

EUV Exposure

Figure 8:
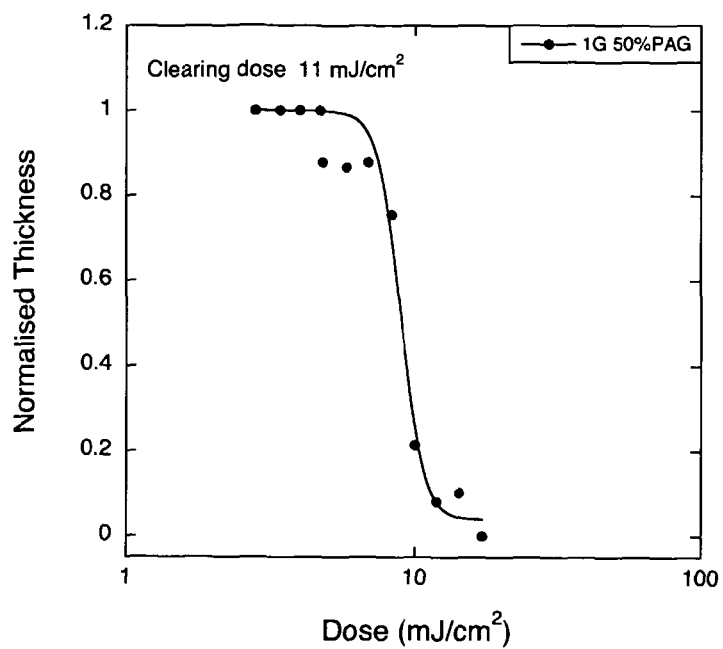
FIG. 8 shows the film thicknesses obtained with methanofullerene derivatives having 2 (Di-MF) addends, following irradiation and development, with different exposures to Extreme Ultraviolet (EUV) radiation.

A sample was prepared as for Example 2. The fullerene used was the di adduct variant (Di-MF) of the tBAC-protected materials (FIG. 1). PAG (triarylsulfonium hexafluoroantimonate) was added in 1:1 ratio, relative to the fullerene resist material. Post application bake was not applied. The resist films were exposed to a range of doses of extreme ultraviolet radiation using the x-ray interference lithography tool at the Swiss Light Source at PSI in Switzerland. A series of exposures were made in a manner analogous to those in Example 3. The film did not receive a post exposure bake in this case. The film was developed using a solution of TMAH at a concentration of 0.026N and rinsed in DI water. FIG. 8 shows the response of the material to irradiation with EUV. It can clearly be seen that doses in excess of ~10-15 mJ/cm$^2$ render the material completely soluble in the developer, whilst doses of less than ~5 mJ/cm$^2$ have no effect on the material.

Figure 9:
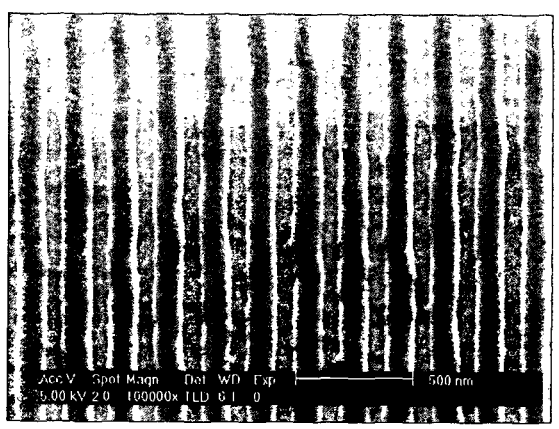
FIG. 9 shows high resolution patterning of a photoresist material using EUV.

FIG. 9 shows the result of high resolution patterning of the positive tone material using extreme ultraviolet. Lines on a pitch of 200 nm are exposed in the resist with a dose at the mask in the PSI tool of 215 mJ/cm$^2$.

The invention claimed is:

1. A methanofullerene derivative comprising a fullerene core of general formula $C_{2x}$ and at least one addend of general formula (I):

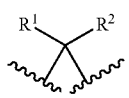
(I)

wherein x is at least 10, and $R^1$ and $R^2$ represent separate or linked organic groups, provided that at least one of $R^1$ and $R^2$ has a structure of general formula (III):

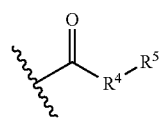
(III)

where $R^4$ is an organic group selected from alkylene, alkenylene, arylene, ether, thioether, and combinations thereof, and $R^5$ is selected from:

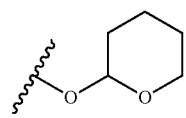
(IV)

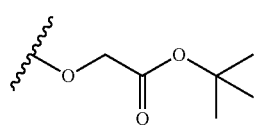
(V)

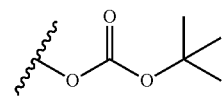
(VI)

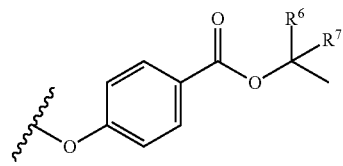
(VII)

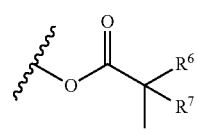
(VIII)

where $R^6$ is $CH_3$ and $R^7$ is $CH_3$, $CH_2CH_3$, or $CH(CH_3)_2$, or $R^6$ is $CH(CH_3)_2$ and $R^7$ is $CH(CH_3)_2$

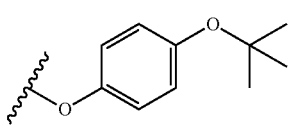
(IX)

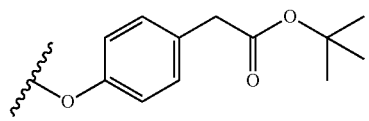
(X)

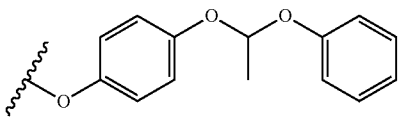
(XI)

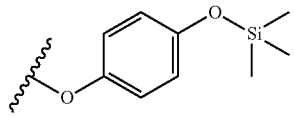
(XII)

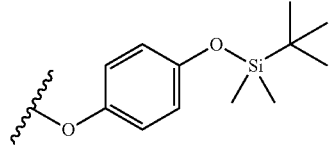
(XIII)

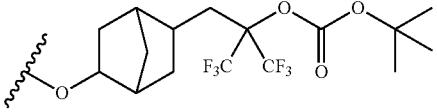
(XIV)

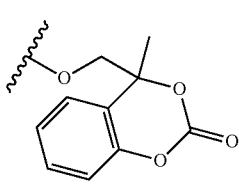
(XV)

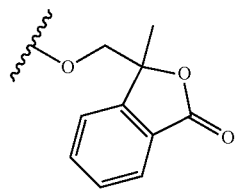
(XVI)

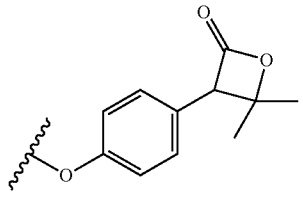
(XVII)

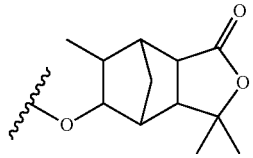
(XVIII)

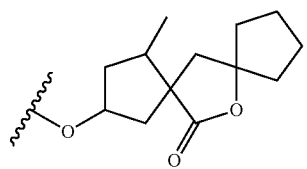
(XIX)

with the exception of the case where $R^4$ is an ether and $R^5$ has structure (IV).

2. The methanofullerene derivative as claimed in claim 1, having between 1 and 6 addends of general formula (I).

3. The methanofullerene derivative as claimed in claim 1, wherein $R^4$ comprises arylene.

4. The methanofullerene derivative as claimed in claim 3, wherein at least one of $R^1$ and $R^2$ has a structure of general formula (A):

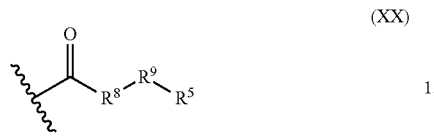
(XX)

where $R^8$ is an organic group selected from alkylene, alkenylene, arylene, ether, thioether, and $R^9$ is arylene or an arylene ether and $R^5$ is as defined in claim 1.

5. The methanofullerene derivative as claimed in claim 4, wherein $R^9$ is p-phenylene ether.

6. The methanofullerene derivative as claimed in claim 1, wherein at least one of $R^1$ and $R^2$ has a structure of general formula (XXI):

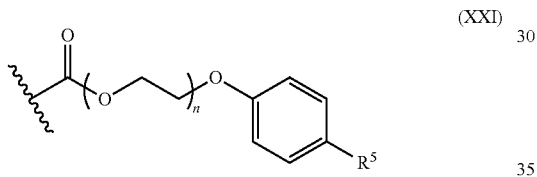
(XXI)

where n=1 to 10 and $R^5$ is as defined in claim 1.

7. The methanofullerene derivative as claimed in claim 6, wherein n=2.

8. The methanofullerene derivative of claim 6, wherein $R^5$ has structure (VI).

9. The methanofullerene derivative as claimed in claim 1, wherein the fullerene core is selected from $C_{50}$, $C_{60}$, and $C_{70}$.

10. The methanofullerene derivative as claimed in claim 1, wherein $R^4$ has between 1 and 20 carbon atoms.

11. The methanofullerene derivative as claimed in claim 10 wherein $R^4$ is selected from methylene, ethylene, trimethylene, tetramethylene, pentamethylene, hexamethylene, heptamethylene, octamethylene, nonamethylene, decamethylene, and branched isomers thereof; and oxyethyl, di(oxyethyl), tri(oxyethyl), tetra(oxyethyl), penta(oxyethyl) and hexa(oxyethyl).

12. A photoresist composition comprising the methanofullerene derivative as claimed in claim 1.

13. The photoresist composition as claimed in claim 12, further comprising a sensitizer.

14. The photoresist composition as claimed in claim 13, wherein the sensitizer comprises a photoacid generator.

15. The photoresist composition as claimed in claim 13, further comprising a quencher for quenching the activity of the sensitizer.

16. A method for formation of a patterned resist layer on a substrate, comprising forming a coating layer on the substrate surface, the coating layer comprising a methanofullerene derivative comprising a fullerene core of general formula $C_{2x}$ and at least one addend of general formula (I):

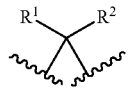
(I)

wherein x is at least 10, and $R^1$ and $R^2$ represent separate or linked organic groups, provided that at least one of $R^1$ and $R^2$ has a structure of general formula (III):

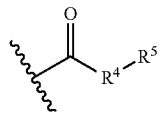
(III)

where $R^4$ is an organic group selected from alkylene, alkenylene, arylene, ether, thioether, and combinations thereof, and $R^5$ is selected from:

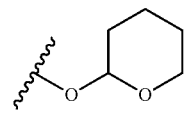
(IV)

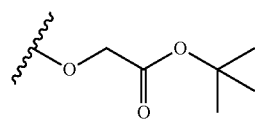
(V)

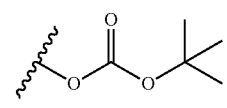
(VI)

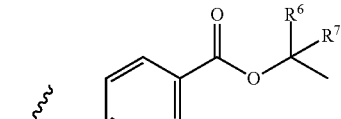
(VII)

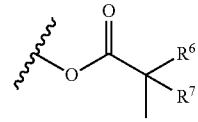
(VIII)

where $R^6$ is $CH_3$ and $R^7$ is $CH_3$, $CH_2CH_3$, or $CH(CH_3)_2$, or $R^6$ is $CH(CH_3)_2$ and $R^7$ is $CH(CH_3)_2$

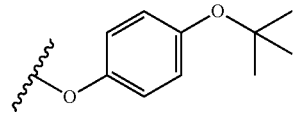
(IX)

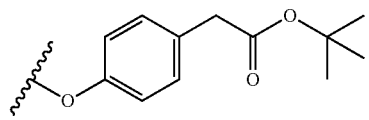
(X)

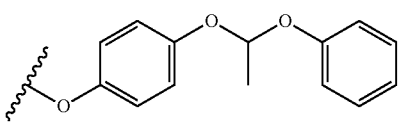
(XI)

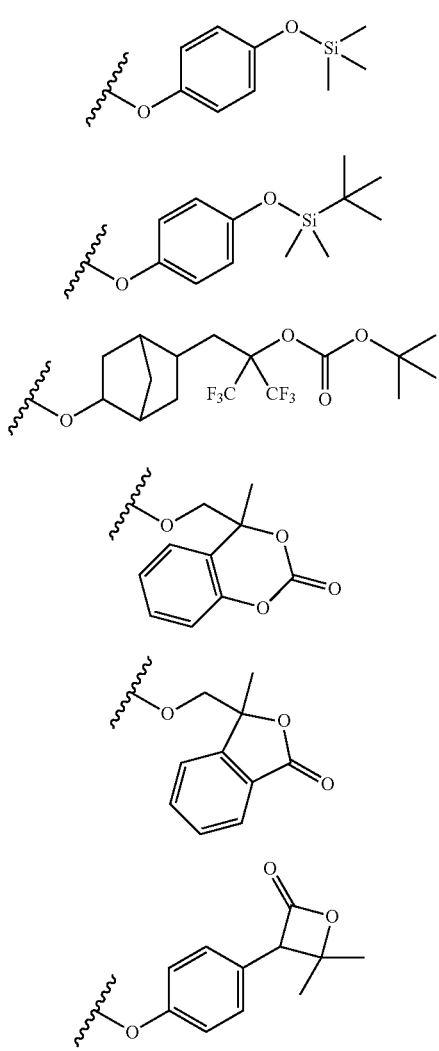
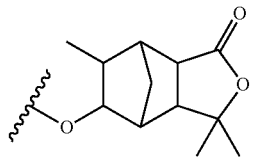
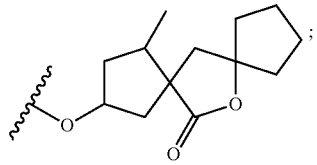

irradiating selected areas of the coating layer with actinic radiation according to the required pattern; and removing irradiated areas of the coating layer.

17. The method as claimed in claim 16, wherein forming a coating layer on a substrate comprises applying a solution of at least the methanofullerene derivative in a solvent, followed by removal of the solvent.

18. The method as claimed in claim 17, wherein the solvent is selected from chloroform, chlorobenzene, dichlorobenzene, anisole, ethyl 3-ethoxypropionate, acetone, isopropyl alcohol/water, chlorobenzene/isopropyl alcohol, ethyl lactate and propylene glycol methyl ether acetate (PGMEA).

19. The method as claimed in claim 16, wherein the actinic radiation comprises radiation selected from an electron beam and extreme ultraviolet radiation (EUV).

20. The method as claimed in claim 16, wherein removing irradiated areas of the coating layer comprises treatment of the coating layer with a polar solvent.

21. The method as claimed in claim 16, further comprising heating of the coated substrate between irradiation with actinic radiation and removal of the irradiated areas.

22. The method as claimed in claim 21, wherein heating of the coated substrate comprises heating to between 80 and 140° C.

* * * * *